United States Patent
Lai et al.

(10) Patent No.: US 11,482,401 B2
(45) Date of Patent: Oct. 25, 2022

(54) ION IMPLANTATION METHOD AND ION IMPLANTER FOR PERFORMING THE SAME

(71) Applicant: Shanghai Huali Integrated Circuit Mfg. Co., Ltd., Shanghai (CN)

(72) Inventors: Chaorong Lai, Shanghai (CN); Leihong Pei, Shanghai (CN)

(73) Assignee: Shanghai Huali Integrated Circuit Mfg. Co. Ltd, Shanghai (CN)

( * ) Notice: Subject to any disclaimer, the term of this patent is extended or adjusted under 35 U.S.C. 154(b) by 289 days.

(21) Appl. No.: 15/930,442

(22) Filed: May 13, 2020

(65) Prior Publication Data

US 2020/0388465 A1 Dec. 10, 2020

(30) Foreign Application Priority Data

Jun. 5, 2019 (CN) .......................... 201910487944.9

(51) Int. Cl.
*H01J 37/31* (2006.01)
*A01D 3/04* (2006.01)
*H01J 37/14* (2006.01)
*H01J 37/20* (2006.01)
*H01J 37/244* (2006.01)
(Continued)

(52) U.S. Cl.
CPC ............ *H01J 37/3171* (2013.01); *A01D 3/04* (2013.01); *H01J 37/1475* (2013.01); *H01J 37/20* (2013.01); *H01J 37/244* (2013.01); *H01L 21/26513* (2013.01); *H01L 39/045* (2013.01);
(Continued)

(58) Field of Classification Search
CPC .... H01J 37/3171; H01J 37/1475; H01J 37/20; H01J 37/244; H01J 2237/20221; H01J 2237/24564; H01J 2237/30483; A01D 3/04; H01L 21/26513; H01L 39/045
USPC ... 250/492.1, 492.2, 492.21, 492.22, 492.23, 250/492.3
See application file for complete search history.

(56) References Cited

U.S. PATENT DOCUMENTS 6,930,316 B2 * 8/2005 Nishihashi .......... H01J 37/3171
850/46
8,884,244 B1 * 11/2014 Purser ................. H01J 37/3023
250/492.1
(Continued)

*Primary Examiner* — Nicole M Ippolito
(74) *Attorney, Agent, or Firm* — Adsero IP

(57) ABSTRACT

The present disclosure provides an ion implantation method and an ion implanter for realizing the ion implantation method. The above-mentioned ion implantation method comprises: providing a spot-shaped ion beam current implanted into the wafer; controlling the wafer to move back and forth in a first direction; controlling the spot-shaped ion beam current to scan back and forth in a second direction perpendicular to the first direction; and adjusting the scanning width of the spot-shaped ion beam current in the second direction according to the width of the portion of the wafer currently scanned by the spot-shaped ion beam current in the second direction. According to the ion implantation method provided by the present disclosure, the scanning path of the ion beam current is adjusted by changing the scanning width of the ion beam current, so that the beam scanning area is attached to the wafer, which greatly reduces the waste of the ion beam current, improves the effective ion beam current and increases productivity without increasing actual ion beam current.

15 Claims, 4 Drawing Sheets

(51) Int. Cl.
*H01L 21/26* (2006.01)
*H01L 39/04* (2006.01)
*H01J 37/317* (2006.01)
*H01J 37/147* (2006.01)
*H01L 21/265* (2006.01)

(52) U.S. Cl.
CPC ............... *H01J 2237/20221* (2013.01); *H01J 2237/24564* (2013.01); *H01J 2237/30483* (2013.01)

(56) References Cited

U.S. PATENT DOCUMENTS

2009/0032726 A1* 2/2009 Sieradzki ............ H01J 37/3171 250/400
2016/0312357 A1* 10/2016 Gammel ............. H01J 37/3171

* cited by examiner

ION IMPLANTATION METHOD AND ION IMPLANTER FOR PERFORMING THE SAME

CROSS-REFERENCES TO RELATED APPLICATIONS

The present application claims priority to Chinese Patent Application No. 201910487944.9, filed on Jun. 5, 2019, entitled "ION IMPLANTATION METHOD AND ION IMPLANTER FOR PERFORMING THE SAME", which is incorporated by reference herein for all purposes.

FIELD

The present disclosure relates to the field of semiconductors, and in particular, to an ion implantation method in the semiconductor field and an ion implantation device for performing the same.

BACKGROUND

The lattice structure of intrinsic silicon is formed by the covalent bonds of silicon. The conductivity of intrinsic silicon is poor. Only when a small amount of impurities is added to silicon to change its structure and conductivity, silicon becomes a useful semiconductor. This process is called doping. Doped impurities cannot be confused with contaminated impurities. There are many reasons for introducing impurities into silicon and other semiconductor materials. Silicon doping is the basis for the preparation of PN junctions in semiconductor devices and is widely used in the entire process of silicon wafer manufacturing, changing the electrical properties of the device. In wafer manufacturing, there are two ways to introduce impurity elements into a silicon wafer, namely thermal diffusion and ion implantation. Thermal diffusion uses high temperatures to drive impurities through the lattice structure of silicon. This method is affected by time and temperature. Ion implantation introduces impurities into the silicon wafer by high-pressure ion bombardment, and the impurities can be implanted only by atomic high-energy collision with the silicon wafer. As feature sizes continue to decrease and corresponding devices shrink, as ion implantation can repeatedly control the concentration and depth of impurities, almost all doping processes in modern wafer manufacturing use ion implantation.

The ion implantation process is performed in an ion implanter, which is one of the most complicated equipment in semiconductor processes. The implanter consists of five parts: ion source, extraction electrode, ion analyzer, acceleration column, scanning system and target chamber. The ion source can generate positively charged impurity ions from the source material. The ions are precipitated and then separated by a mass analyzer to form a beam with ions that needs to be doped. The number of ions in the beam is related to the concentration of impurities desired to be introduced into the wafer. The ion beam is accelerated in the electric field to obtain a very high velocity, so that the ions have sufficient kinetic energy to be implanted into the crystal structure of the silicon wafer. The ion beam scans the entire silicon wafer so that the surface of the silicon wafer is uniformly doped. The thermal annealing process after implantation will activate the impurity ions in the lattice structure, and all implantation processes are performed under high vacuum conditions.

The purpose of ion implantation is to form a pure ion beam in terms of composition and energy, and inject a pure ion beam current into the target silicon wafer. That is, the ion beam contains only desired impurity ions having a predetermined energy level. In the currently commonly used ion implantation, the beam spot of a focused ion beam is usually small. Therefore, this method is also called spot beam implantation. Because the beam spot of the focused ion beam is small, in order to ensure that the ion implantation covers the entire silicon wafer, the scanning of the focused ion beam needs to cover the entire silicon wafer. Common scanning methods include: fixing the silicon wafer then moving the beam spot, fixing the beam spot then moving the silicon wafer, or hybrid scanning. Focused ion beam scanning plays a key role in the uniformity and repeatability of the implanted ion dose.

Please refer to FIG. 1A and FIG. 1B. FIG. 1A and FIG. 1B show schematic diagrams of a conventional hybrid scanning. As shown in FIG. 1A, the wafer 100 is moved in a first direction, and the spot-shaped ion beam 110 is scanned in a second direction. For the convenience of control and ensuring the uniform doping of the surface of the silicon wafer at the same time, the ion beam current 110 is controlled to become an equal-length beam current in the second direction. Finally, the relative path of ion implantation is rectangular or square, as shown in FIG. 1B. Although the scanning method shown in FIGS. 1A and 1B is simple to control and can ensure the uniformity of doping on the surface of the silicon wafer, since the wafers are all circular patterns, some ion beams are implanted into the cavity walls and other unnecessary area, causing the waste of the ion beam and it also becomes a main body of the particle source of the ion implantation cavity.

Therefore, there is an urgent need for an ion implantation method, especially an ion implantation scanning method, which can solve the above problems, make the beam scanning path fit on the wafer, reduce the waste of the beam, increase the effective beam flow, and increase production capacity without increasing actual beam current.

SUMMARY

A brief summary on one or more embodiments is given below to provide the basic understanding for these embodiments. This summary is not an exhaustive overview of all the contemplated embodiments and is neither intended to indicate critical or decisive elements of all embodiments nor to attempt to define the scope of any or all embodiments. Its sole purpose is to present some concepts of one or more embodiments in a simplified form as a preface for a more detailed description presented later.

In order to solve the above problems, the present disclosure provides an ion implantation method, comprising:

providing a spot-shaped ion beam current implanted into the wafer;

controlling the wafer to move back and forth in a first direction;

controlling the spot-shaped ion beam current to scan back and forth in a second direction perpendicular to the first direction; and adjusting the scanning width of the spot-shaped ion beam current in the second direction according to the width of the portion of the wafer currently scanned by the spot-shaped ion beam current in the second direction.

In an embodiment of the foregoing ion implantation method, adjusting the scanning width of the spot-shaped ion beam current in the second direction according to the width of the portion of the wafer currently scanned by the spot-shaped ion beam current in the second direction further comprises:

increasing the scanning width of the spot-shaped ion beam current in the second direction as the width of the portion of the wafer currently scanned by the spot-shaped ion beam current in the second direction increase, reducing the scanning width of the spot-shaped ion beam current in the second direction as the width of the portion of the wafer currently scanned by the spot-shaped ion beam current in the second direction reduce.

In an embodiment of the foregoing ion implantation method, the ion implantation method further comprises:

determining the width of the portion of the wafer currently scanned by the spot-shaped ion beam current in the second direction according to the distance that the wafer moves back and forth in the first direction.

In an embodiment of the foregoing ion implantation method, the ion implantation method further comprises:

determining the width of the portion of the wafer currently scanned by the spot-shaped ion beam current in the second direction as the width of the ion beam current implanted into the wafer obtained by a beam current sensor placed behind the wafer.

In an embodiment of the foregoing ion implantation method, the beam current sensor is a faraday cup.

In an embodiment of the foregoing ion implantation method, controlling the spot-shaped ion beam current to scan back and forth in a second direction further comprises:

controlling the spot-shaped ion beam current to pass through a deflection unit, the electromagnetic field generated by the deflection unit deflects the spot-shaped ion beam current in a second direction; and continuously adjusting the direction of the electromagnetic field generated by the deflection unit to control the spot-shaped ion beam current to move back and forth in the second direction.

In an embodiment of the foregoing ion implantation method, adjusting the scanning width of the spot-shaped ion beam current in the second direction further comprises:

continuously adjusting the intensity of the electromagnetic field to adjust the scanning width of the spot-shaped ion beam current in the second direction.

In an embodiment of the foregoing ion implantation method, the ion implantation method further comprises:

controlling the scanning frequency of the spot-shaped ion beam current to be scanned back and forth in the second direction to control the uniformity of the spot-shaped ion beam current implanted into the wafer.

In an embodiment of the foregoing ion implantation method, the scanning frequency is controlled to be 1000±10% hertz.

The present disclosure also provides an ion implanter for realizing any one of the above-mentioned ion implantation methods.

The ion implantation method provided by the present disclosure changes the lateral scanning path of the beam by changing the lateral scanning width of the beam during the upward and downward movement of the wafer relative to the beam, so that the scanning path has a circular distribution. As a result, the beam scanning area fits perfectly on the wafer, greatly reducing the waste of the beam, increasing the effective beam flow, and increasing the production capacity without increasing the actual beam current.

BRIEF DESCRIPTION OF THE DRAWINGS

The embodiments of the present disclosure will be better understood from the following description of the appended claims. In the figures, components are not necessarily drawn to scale, and components having similar related features or features may have the same or similar reference numerals.

REFERENCE SIGNS

Figure 1A:
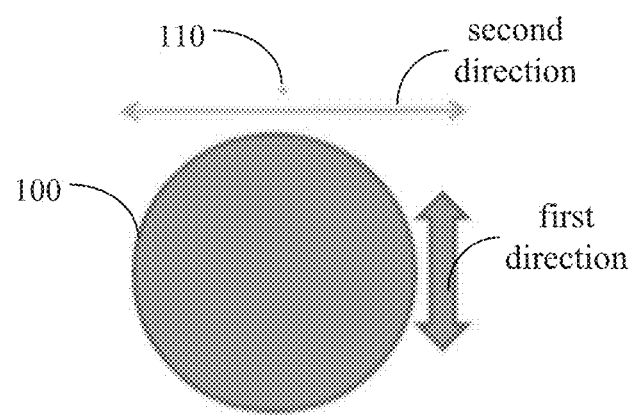
FIGS. 1A and 1B are schematic diagrams of a scanning process in the prior art.

| | |
|---|---|
| 100, 300 | wafer |
| 110, 310 | spot ion beam current |
| 410 | ion source |
| 420 | extraction component |
| 430 | analyzing magnet |
| 440 | accelerator |
| 450 | focusing anode |
| 460 | neutral beam trap |
| 470 | X and Y axis deflection unit |
| 480 | wafer |
| 490 | Faraday cup |

DETAILED DESCRIPTION

The present disclosure relates to semiconductor processes and devices, and an embodiment of the ion implantation method provided by the present disclosure changes the lateral scanning path of the beam by changing the lateral scanning width of the beam during the upward and downward movement of the wafer relative to the beam, so that the scanning path has a circular distribution. As a result, the beam scanning area fits perfectly on the wafer, greatly reducing the waste of the beam, increasing the effective beam flow, and increasing the production capacity without increasing the actual beam current. The disclosure also provides other embodiments.

The disclosure is described in detail below with reference to the drawings and specific embodiments. It is to be noted that the embodiments described below in conjunction with the drawings and the specific embodiments are merely exemplary and are not to be construed as limiting the scope of the disclosure.

disclosure In some embodiments, various modifications, as well as various usages in various applications, will be readily apparent, and the generic principles defined herein may be applicable to a wide range of embodiments. Thus, the present disclosure is not limited to the embodiments presented herein, but rather should be given its broadest scope consistent with the principles and novel features disclosed herein.

In the following detailed description, numerous specific details are set forth to provide a more thorough understanding of the present disclosure. disclosure In other words, well-known structures and devices are shown in a block diagram form and are not shown in detail, to avoid obscuring the present disclosure.

The reader is cautioned as to all files and documents which are filed at the same time as this specification and which are open for the public to consult, and the contents of all such files and documents are incorporated herein by reference. Unless directly stated otherwise, all features disclosed in this specification (including any of the appended claims, the abstract, and the accompanying drawings) may be replaced by alternative features serving the same, equivalent, or similar purposes. Therefore, unless expressly stated otherwise, each of the features disclosed is only one example of a group of equivalent or similar features.

Note that when used, the flags left, right, front, back, top, bottom, front, back, clockwise, and counter-clockwise are used for convenience purposes only and do not imply any specific fixed direction. In fact, they are used to reflect the relative position and/or direction between various parts of an object.

As used herein, the terms "over . . . "under . . . ", "between . . . and . . . ", and "on . . . " means the relative position of that layer relative to another layer. Likewise, for example, a layer that is deposited or placed over or under another layer may be in direct contact with another layer or there may be one or more intervening layers. In addition, a layer that is deposited or placed between layers may be in direct contact with the layers or there may be one or more intervening layers. In contrast, a first layer "on" a second layer is in contact with the second layer. In addition, a relative position of a layer relative to another layer is provided (assuming that film operations of deposition, modification, and removal are performed in relative to a starting substrate, without considering the absolute orientation of the substrate).

Figure 1B:
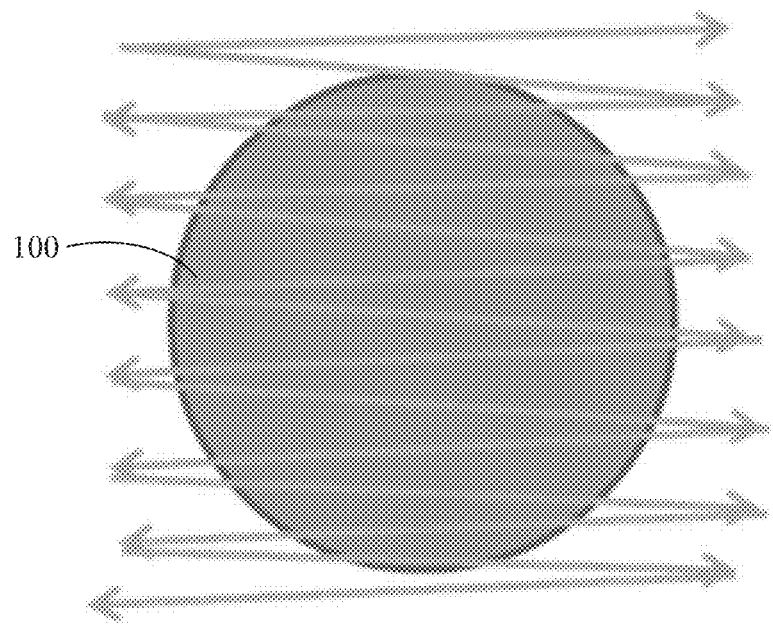

As described above, FIG. 1A and FIG. 1B show schematic diagrams of a conventional hybrid scanning. As shown in FIG. 1A, the wafer 100 moves in a first direction, and the ion beam current 110 is controlled to become an equal-length beam current in a second direction perpendicular to the first direction, so that the spot-shaped ion beam current 110 is scanned in the second direction. In the aforementioned prior art, the scanning width of the spot-shaped ion beam 110 in the second direction is a fixed value, in this way, the control for setting the spot-shaped ion beam 110 to deflect in the second direction can be set in an open loop. For example, if the size of the wafer is known, a scan width larger than the size of the wafer may be set according to a preset rule. The scanning of the spot-shaped ion beam 110 in the second direction does not need to be monitored. By setting a scan width larger than the wafer size, it is also possible to ensure uniform doping on the surface of the silicon wafer. Finally, the relative path of ion implantation is rectangular or square, as shown in FIG. 1B. Although the scanning method shown in FIGS. 1A and 1B is simple to control and can ensure the uniformity of doping on the surface of the silicon wafer, since the wafers are all circular patterns, some ion beams are implanted into the cavity walls and other unnecessary area, causing the waste of the ion beam and it also becomes a main body of the particle source of the ion implantation cavity.

Figure 2:
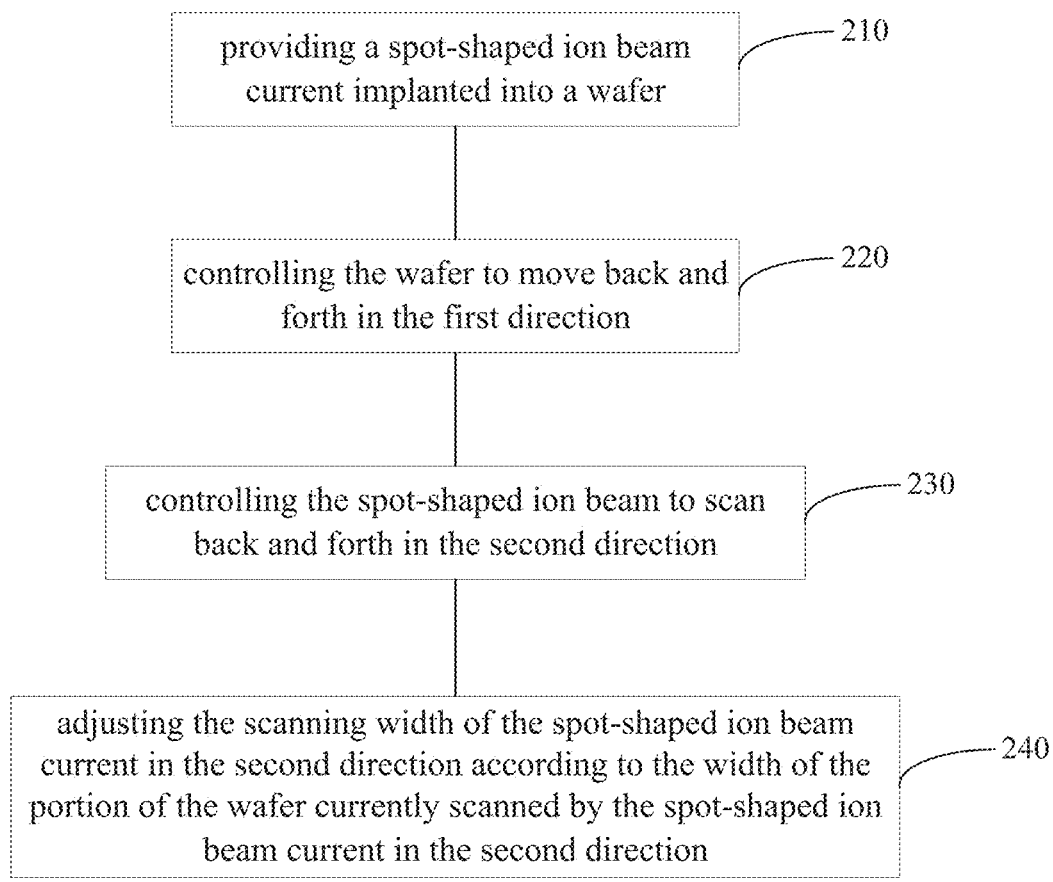
FIG. 2 is a schematic flowchart of an ion implantation method according to an embodiment of the present disclosure.

In order to solve the above problem, the present disclosure provides an ion implantation method. Please refer to the flow chart shown in FIG. 2. The ion implantation method provided by the present disclosure includes: step 210: providing a spot-shaped ion beam current implanted into a wafer; step 220: controlling the wafer to move back and forth in the first direction; step 230: controlling the spot-shaped ion beam to scan back and forth in the second direction; and step 240: adjusting the scanning width of the spot-shaped ion beam current in the second direction according to the width of the portion of the wafer currently scanned by the spot-shaped ion beam current in the second direction.

In one embodiment, in step 210, a spot-shaped ion beam current that meets the requirements and is implanted into the wafer can be provided through various existing or future methods. Please also refer to the ion implanter shown in FIG. 4. Generally speaking, in order to provide a spot-shaped ion beam that is implanted into a wafer, the ion implanter usually needs to include an ion source 410, an extraction component 420, an analyzing magnet 430, an accelerator 440, a focusing anode 450, a neutral beam trap 460 and so on.

The ion source 410 and the extraction component 420 are usually placed in a same vacuum chamber. The ion source 410 generates positive ions from gaseous or solid impurities, and the extraction component 420 uses a negative high-voltage electric field to drag the positive ions out of the ion source 410 and force them to form an ion beam. The ions extracted from the ion source 410 may include many different kinds of ions, which move at a high speed under the acceleration of the electric field of the extraction component 420. Different ions have different atomic masses, and the analysis magnet 430 of the implanter can separate the required impurity ions from the mixed ion beam. In order to obtain higher speed (implantation energy), in addition to the analyzing magnet 430, the positive ions are accelerated under the electric field of the accelerator 440. The accelerator 440 is composed of a series of electrodes isolated by dielectrics. When positive ions enter the accelerator 440, they begin to accelerate. The higher the total voltage difference between the electrodes of the accelerator 440, the greater the speed of the ions, that is, the greater the energy. The accelerated ions are focused by the focusing anode 450. A positively charged ion beam is formed under vacuum, but there are still residual gas molecules. When an impurity ion collides with a residual gas molecule to obtain an electron, a neutral ion is formed. Neutral ions have no charge and cannot be deflected. If they cannot be taken out, they will be implanted with the ion beam onto the wafer surface. Therefore, the ion beam to be implanted on the wafer surface needs to be passed through the neutral beam trap 460, so that the deflection electrode is used to deflect the ion beam within a distance before entering the target chamber. Since the neutral ions cannot be deflected by the electrodes, they will continue to go straight and hit the collection plate, separating them from the ion beam to be implanted into the wafer surface.

It should be noted that although an embodiment of the above-mentioned ion implanter for generating a spot-shaped ion beam implanted into a wafer is described, the above description is not a limitation on the method and device for generating a spot-shaped ion beam that meets the implantation conditions.

In one embodiment, in step 220, when the wafer is controlled to move back and forth in the first direction, the wafer is loaded on a stage, and the movement of the wafer is driven by the movement of the stage. In one embodiment, in the target chamber of the ion implanter, the displacement of the stage is usually controlled by a stepping motor. The stepping motor converts the pulse signal into angular displacement or linear displacement and rotates in 'step'. The digital features of the stepping motor are relatively obvious, which can effectively and accurately control the movement of the stage. In one embodiment, by controlling the stepping motor to drive the wafer back and forth in the first direction, the width of the wafer area currently scanned by the spot ion beam in the second direction can be accurately obtained according to the position of the stepping motor and the size of the wafer, which can provide a basis for adjusting the scanning width of the ion beam current in the second direction.

In one embodiment, in step 230 of controlling the spot-shaped ion beam to scan back and forth in the second direction, the spot-shaped ion beam current that meets the implantation conditions formed in step 210 will pass through the deflection unit, and the ion beam current is deflected in the second direction by the deflection unit, so that the spot-shaped ion beam scans back and forth in the second direction.

Figure 4:
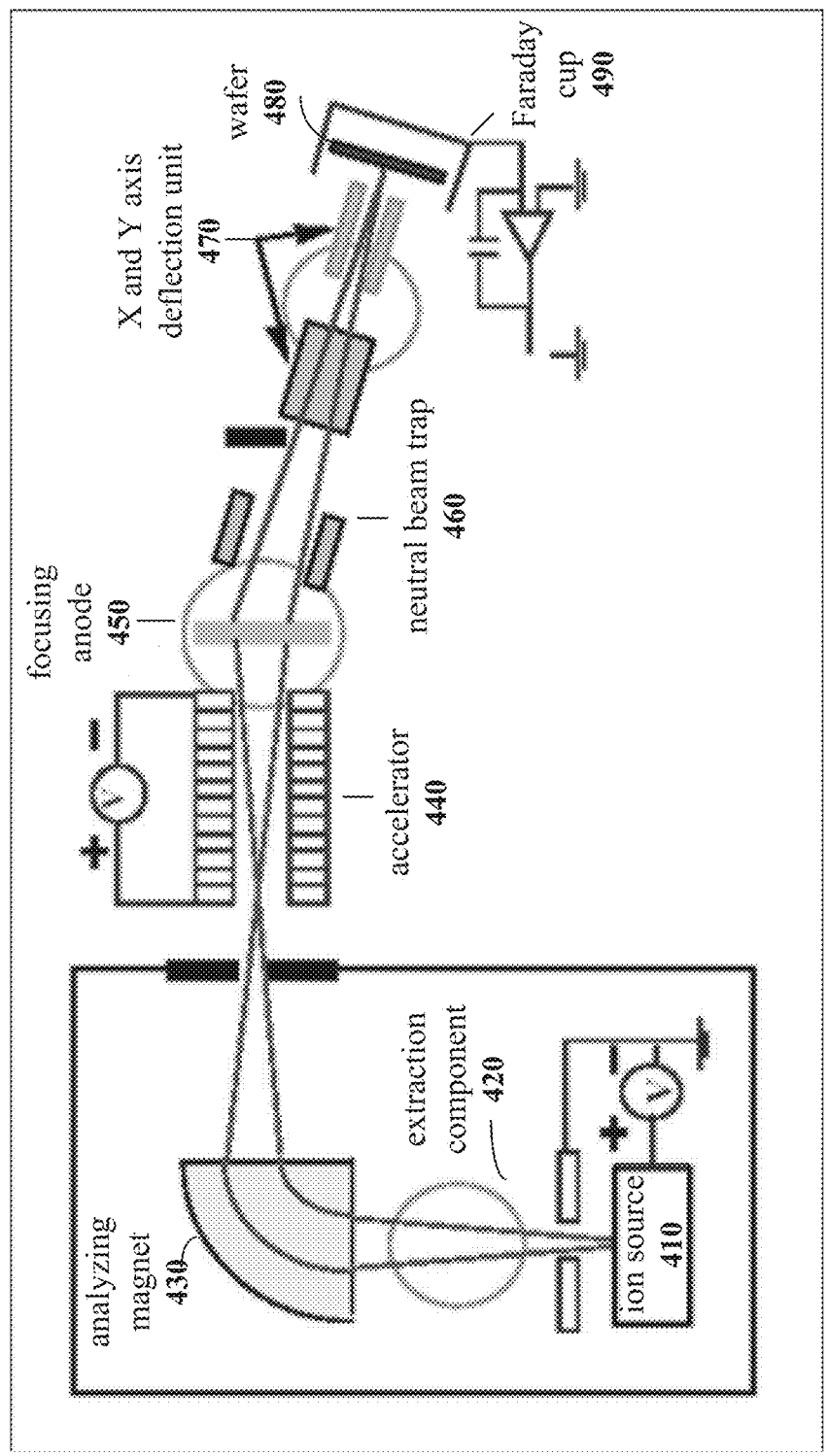
FIG. 4 is a schematic structural diagram of an embodiment of an ion implanter that implements the ion implantation method provided by the present disclosure.

Please refer to FIG. 4, which shows two deflection units 470 in two different directions of the X and Y axes. The X-axis deflection unit can deflect the spot-shaped ion beam current in the X direction, and the Y-axis deflection unit can deflect the spot-shaped ion beam current in the Y direction. Embodiments of present disclosure may include that although the X and Y axis deflection units 470 are both shown in FIG. 4, for the embodiments provided by the present disclosure, it is only necessary to control the ion beam current to deflect in one direction, that is, only one of the X or Y axis deflection units needs to be enabled. In one embodiment, the above-mentioned first direction may be characterized as an X-axis. At this time, in the embodiments provided by the present disclosure, the wafer is moved back and forth on the X-axis by controlling the movement of the stage, and by enabling the Y-axis deflection unit, the spot-shaped ion beam scans back and forth in the Y direction. Similarly, the above-mentioned first direction can be characterized as the Y axis. At this time, in the embodiments provided by the present disclosure, the wafer is moved back and forth on the Y axis by controlling the movement of the stage, and by enabling the X axis deflection unit, the spot-shaped ion beam scans back and forth in the X direction. Embodiments of the present disclosure may adjust the relative relationship between the first direction, the second direction, X and Y according to actual needs, so that selecting one of the X or Y axis deflection units according to the above relative relationship is not a limitation on this solution.

In one embodiment, the above-mentioned deflection unit is a set of electrodes configured in corresponding direction. By controlling the voltage of the electrodes, an electromagnetic field is generated, and the spot-shaped ion beam passing through the deflection unit is deflected in the corresponding direction by the force. By continuously adjusting the voltage, the direction of the electromagnetic field generated by the deflection unit can be continuously adjusted, and the spot-shaped ion beam can be scanned back and forth in the second direction. Further, by controlling the reversing frequency of the electromagnetic field generated by the deflection unit, it is possible to effectively control the scanning frequency of the spot-shaped ion beam implanted into the wafer. By increasing the scanning frequency, the ion implantation on the wafer surface can be made more uniform.

Furthermore, by adjusting the strength of the electromagnetic field generated by the deflection unit, the degree of deflection of the spot-shaped ion beam current in the second direction can be adjusted, so that the scanning width of the spot-shaped ion beam current in the second direction can be adjusted. Further, by continuously adjusting the magnitude of the voltage, the strength of the electromagnetic field generated by the deflection unit can be continuously adjusted, so that the scanning width of the spot-shaped ion beam current in the second direction can be continuously changed in step 240.

Furthermore, in step 240, the scanning width of the spot-shaped ion beam current in the second direction is adjusted to be a width of a portion of the wafer currently scanned by the spot-shaped ion beam current in the second direction. Therefore, the method provided by the present disclosure further includes: obtaining the width of the portion of the wafer currently scanned by the spot-shaped ion beam current in the second direction.

In one embodiment, as described in the above section regarding the wafer stage driving the wafer moving, the displacement data of the wafer stage can be obtained through the output of the stepping motor, so that the wafer movement data in the first direction can be obtained. In addition, by obtaining the size of the wafer, the width of the portion of the wafer currently scanned by the spot-shaped ion beam current in the second direction can be determined by the moving distance of the wafer. Therefore, the scanning width of the spot-shaped ion beam in the second direction can be adjusted by the width of the portion of the wafer currently scanned by the spot-shaped ion beam current in the second direction. Therefore, it is possible to control the superposed ion implantation scanning path to conform to the shape of the wafer, reduce the waste of beam current, and increase the effective beam flow.

In another embodiment, obtaining the width of the portion of the wafer currently scanned by the spot-shaped ion beam current in the second direction may be achieved by setting a beam current sensor behind the wafer. The beam current sensor can obtain a width of the ion beam implanted into the wafer, which can be used as the width of the portion of the wafer currently scanned by the spot-shaped ion beam in the second direction.

In one embodiment, the beam current sensor may be a Faraday cup 490 as shown in FIG. 4. The Faraday cup 490 is placed behind the wafer 480 and has a multi-point Faraday cup system structure. A Faraday cup can measure the current value of an ion beam based on the ion beam it receives. Since the Faraday cup 490 is placed behind the wafer 480, the ion beam that is actually implanted on the wafer surface is blocked by the wafer 480. The Faraday cup corresponding to this part will not receive the ion beam and will not measure the current value of the ion beam. According to the position and size of the Faraday cup where the current value is not measured, the width of the ion beam implanted into the wafer can be obtained, reflecting the width of the portion of the wafer currently scanned by the spot-shaped ion beam in the second direction.

It should be noted that the above-mentioned example of the beam sensor being a Faraday cup is merely illustrative, and is not a limitation on the beam sensor. Embodiments of the disclosure may use existing or future sensors for detecting ion beam.

In one embodiment, the width of the wafer portion currently scanned by the spot-shaped ion beam current in the second direction can be obtained simultaneously by acquiring the distance that the wafer moves back and forth in the first direction and by the beam sensor. Although the width can be obtained by the distance that the wafer moves back and forth in the first direction, the obtained width is calculated from the displacement of the stepping motor and the original size of the wafer. If the beam width can be detected by the beam sensor at the same time, the forward and feedback data can accurately determine the width of the wafer portion currently scanned by the spot ion beam in the second direction, closed-loop control can be effectively formed.

After obtaining the width of the portion of the wafer currently scanned by the spot-shaped ion beam current in the second direction, in step 240, the method further includes adjusting the scanning width of the spot-shaped ion beam current in the second direction based on the width. In one embodiment, the scanning width of the spot-shaped ion beam current in the second direction increases as the width of the portion of the wafer currently scanned by the spot-shaped ion beam current in the second direction increases, and decreases as the width of the portion of the wafer currently scanned by the spot-shaped ion beam current in the second direction decreases.

In the existing method, the scanning width does not change with the width of the portion of the wafer currently scanned by the spot-shaped ion beam in the second direction. Therefore, when the width of the portion of the wafer currently scanned by the spot-shaped ion beam current in the second direction is small, the scanning width of the spot-shaped ion beam current is still large, resulting in a waste of the spot-shaped ion beam current.

Figure 3A:
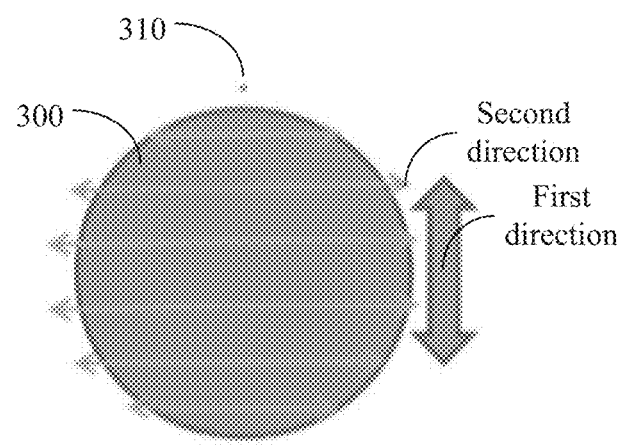
FIGS. 3A and 3B are schematic diagrams illustrating the scanning process of an ion implantation method provided according to an embodiment of the present disclosure.
Figure 3B:
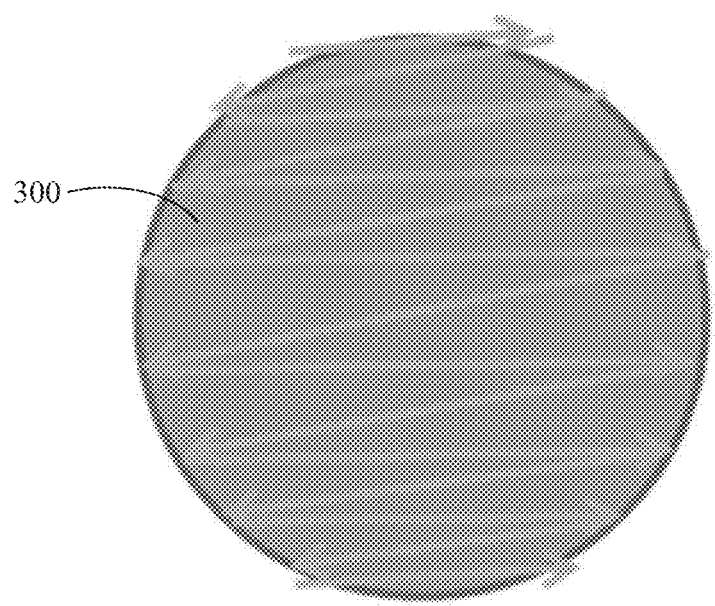

According to the method provided by the present disclosure, please refer to FIGS. 3A and 3B which show the scanning path of the spot-shaped ion beam after adopting the method provided by the present disclosure, by changing the scanning width of the beam, in the present disclosure, the scanning path of the spot-shaped ion beam presents a circular distribution, making the beam scanning fit to the wafer, greatly reducing the waste of the beam, increasing the effective beam flow and increasing the production capacity without increasing the actual beam current.

Further, although it is desirable to be able to control the scanning path of the ion beam flow to perfectly fit the wafer, in order to make the ion implantation completely cover the entire wafer surface, the scanning width of the spot-shaped ion beam needs to be adjusted to be slightly larger than the width of the current wafer in the second direction. In one embodiment, a fixed amount value (5 mm for example) can be set according to actual needs. Thus, when the width of the current wafer in the second direction is 200 mm, the scanning width of the spot-shaped ion beam in the second direction can be 205 mm. In another embodiment, an enlargement ratio (5% for example) may be set according to actual needs. Thus, when the width of the current wafer in the second direction is 200 mm, the scanning width of the controlled spot-shaped ion beam flow in the second direction can be 210 mm.

Embodiments of the disclosure provide that although the width of the spot-shaped ion beam is slightly larger than the width of the wafer, it will still cause some waste and pollution. The method provided according to the present disclosure has been able to reduce the above waste to the minimum acceptable range. Further, the above setting for the width slightly larger than the width of the wafer in the second direction may be adjusted according to actual needs, and is not limited to the above examples.

In order to make the spot-shaped ion beam current implanted into the wafer surface more uniform, the ion implantation method provided by the present disclosure further includes adjusting a scanning frequency of the spot-shaped ion beam current implanted into the wafer surface. By adjusting the scanning frequency of the spot-shaped ion beam implanted into the wafer surface to a higher frequency, the uniformity of the spot-shaped ion beam implanted into the wafer surface can be effectively improved. In one embodiment, the scanning frequency is controlled in a range of 1000±10% Hz. Limited by the physical limits of the ion implanter, a frequency of 1000±10% Hz is already a high scanning frequency for ion implantation. In some embodiments, the above examples of higher frequencies are merely exemplary and are not limiting. If some technologies can further increase the scanning frequency, a higher scanning frequency can be set to better guarantee the uniformity of the spot-shaped ion beam implanted into the wafer surface.

So far, the ion implantation method provided by the present disclosure has been described. According to the ion implantation method provided by the present disclosure, by changing the lateral scanning path of the beam current, the complete scanning path can be circularly distributed, so that the scanning area of the beam match the wafer. The beam is concentratedly implanted into the wafer, reducing the beam implantation in the non-wafer area, greatly reducing the waste of the beam, increasing the effective beam flow, and increasing the production capacity without increasing the actual beam. Compared with the original process, the entire process improves the unit time output of the implanter by increasing the effective beam implantation without increasing the beam current, while reducing the pollution to the cavity wall of the implanter and reducing the generation of particles.

Further, the present disclosure also provides an ion implanter for implementing the above-mentioned ion implantation method. In one embodiment, it includes at least a spot-shaped ion beam generating part, a spot-shaped ion beam scanning system, and a terminal station for loading and unloading a silicon wafer. Please refer to the ion implanter shown in FIG. 4. The generating part of the spot-shaped ion beam may include an ion source 410, an extraction component 420, an analyzing magnet 430, an accelerator 440, a focusing anode 450, a neutral beam trap 460 and so on.

The ion source 410 and the extraction component 420 are usually placed in the same vacuum chamber. The ion source 410 generates positive ions from gaseous or solid impurities, and the extraction component 420 uses a negative high-voltage electric field to drag the positive ions out of the ion source 410 and force them to form an ion beam. The ions extracted from the ion source 410 may include many different kinds of ions, which move at a high speed under the acceleration of the electric field of the extraction component 420. Different ions have different atomic masses, and the analysis magnet 430 of the implanter can separate the required impurity ions from the mixed ion beam. In order to obtain higher speed (implantation energy), in addition to the analyzing magnet 430, the positive ions are accelerated under the electric field of the accelerator 440. The accelerator 440 is composed of a series of electrodes isolated by dielectrics. When positive ions enter the accelerator 440, they begin to accelerate. The higher the total voltage difference between the electrodes of the accelerator 440, the greater the speed of the ions, that is, the greater the energy. The accelerated ions are focused by the focusing anode 450. A positively charged ion beam is formed under vacuum, but there are still residual gas molecules. When an impurity ion collides with a residual gas molecule to obtain an electron, a neutral ion is formed. Neutral ions have no charge and cannot be deflected. If they cannot be taken out, they will be implanted with the ion beam onto the wafer surface. Therefore, the ion beam implanted on the wafer surface needs to be passed through the neutral beam trap 460, so that the deflection electrode is used to deflect the ion beam within a distance before entering the target chamber. Since the neutral ions cannot be deflected by the electrodes, they will continue to go straight and hit the collection plate, separating them from the ion beam implanted into the wafer surface.

The spot-shaped ion beam scanning system may include an X or Y-axis deflection unit 470 that deflects the generated spot-shaped ion beam current. The embodiment shown in FIG. 4 includes an X-axis deflection unit and a Y-axis deflection unit. The X-axis deflection unit can deflect the spot-shaped ion beam current in the X direction, and the Y-axis deflection unit can deflect the spot-shaped ion beam current in the Y direction. In some embodiments, that although the X and Y axis deflection units 470 are both shown in FIG. 4, for embodiment provided by the present disclosure, it is only necessary to control the ion beam current to deflect in one direction, that is, only one of the X or Y axis deflection units needs to be enabled.

The terminal stage for loading and unloading the silicon wafer may include a stage for moving the wafer 480. The displacement of the stage is usually controlled by a stepping motor. The stepping motor converts the pulse signal into angular displacement or linear displacement and rotates in 'step'. The digital features of the stepping motor are relatively obvious, which can effectively and accurately control the movement of the stage. Because of this, by controlling the stepping motor to drive the wafer back and forth in the first direction, the width of the wafer area currently scanned by the spot ion beam in the second direction can be accurately obtained according to the position of the stepping motor and the size of the wafer, which can provide a basis for adjusting the scanning width of the ion beam current in the second direction.

In one embodiment, obtaining the width of the portion of the wafer currently scanned by the spot-shaped ion beam current in the second direction may be achieved by setting a beam current sensor behind the wafer. The beam current sensor can obtain the width of the ion beam implanted into the wafer which can be used as the width of the portion of the wafer currently scanned by the spot-shaped ion beam in the second direction.

In one embodiment, the beam current sensor may be a Faraday cup 490 as shown in FIG. 4. The Faraday cup 490 is placed behind the wafer 480 and has a multi-point Faraday cup system structure. A Faraday cup can measure the current value of an ion beam based on the ion beam it receives. Since the Faraday cup 490 is placed behind the wafer 480, the ion beam that is actually implanted on the wafer surface is blocked by the wafer 480. The Faraday cup corresponding to this part will not receive the ion beam and will not measure the current value of the ion beam. According to the position and size of the Faraday cup where the current value is not measured, the width of the ion beam implanted into the wafer can be obtained, reflecting the width of the portion of the wafer currently scanned by the spot-shaped ion beam in the second direction.

Heretofore, embodiments of an ion implantation method and an ion implanter implementing the same have been described. Although the present disclosure has been described with respect to some exemplary embodiments, it will be apparent that various modifications and changes may be made to these embodiments without departing from the more general spirit and scope of the disclosure. Accordingly, the specification and the accompanying drawings are to be regarded in an illustrative rather than a restrictive sense.

It is to be understood that this description is not intended to explain or limit the scope or meaning of the claims. In addition, in the detailed description above, it can be seen that various features are combined together in a single embodiment for the purpose of simplifying the disclosure. The method of the present disclosure should not be interpreted as reflecting the intention that the claimed embodiments require more features than those expressly listed in each claim. Rather, as reflected by the appended claims, an inventive subject matter lies in being less than all features of a single disclosed embodiment. Therefore, the appended claims are hereby incorporated into the detailed description, with each claim standing on its own as a separate embodiment.

One embodiment or embodiments mentioned in this description is/are intended to be, combined with a particular feature, structure, or characteristic described in the embodiment, included in at least one embodiment of a circuit or method. The appearances of phrases in various places in the specification are not necessarily all referring to a same embodiment.

What is claimed is:

1. An ion implantation method, comprising:
   providing a spot-shaped ion beam implanted into a wafer;
   controlling the wafer to move back and forth in a first direction;
   controlling the spot-shaped ion beam to scan back and forth in a second direction perpendicular to the first direction; and
   adjusting a scanning width of the spot-shaped ion beam in the second direction according to a width of a portion of the wafer currently scanned by the spot-shaped ion beam in the second direction.

2. The ion implantation method according to claim 1, wherein adjusting the scanning width of the spot-shaped ion beam in the second direction according to the width of the portion of the wafer currently scanned by the spot-shaped ion beam in the second direction further comprises:
   increasing the scanning width of the spot-shaped ion beam in the second direction as the width of the portion of the wafer currently scanned by the spot-shaped ion beam in the second direction increases, and reducing the scanning width of the spot-shaped ion beam in the second direction as the width of the portion of the wafer currently scanned by the spot-shaped ion beam in the second direction reduces.

3. The ion implantation method according to claim 1, wherein the ion implantation method further comprises:
   determining the width of the portion of the wafer currently scanned by the spot-shaped ion beam in the second direction according to a distance that the wafer moves back and forth in the first direction.

4. The ion implantation method according to claim 1, wherein the ion implantation method further comprises:
   determining the width of the portion of the wafer currently scanned by the spot-shaped ion beam in the second direction as a width of the spot-shaped ion beam implanted into the wafer obtained by a beam sensor placed behind the wafer.

5. The ion implantation method according to claim 4, wherein the beam sensor is a faraday cup.

6. The ion implantation method according to claim 1, wherein controlling the spot-shaped ion beam to scan back and forth in a second direction further comprises:
   controlling the spot-shaped ion beam to pass through a deflection unit, an electromagnetic field generated by the deflection unit deflects the spot-shaped ion beam in the second direction; and
   continuously adjusting a direction of the electromagnetic field generated by the deflection unit to control the spot-shaped ion beam to move back and forth in the second direction.

7. The ion implantation method according to claim 6, wherein adjusting the scanning width of the spot-shaped ion beam in the second direction further comprises:
continuously adjusting an intensity of the electromagnetic field to adjust the scanning width of the spot-shaped ion beam in the second direction.

8. The ion implantation method according to claim 1, wherein the ion implantation method further comprises:
controlling a scanning frequency of the spot-shaped ion beam scanning back and forth in the second direction to control uniformity of the spot-shaped ion beam implanted into the wafer.

9. The ion implantation method according to claim 8, wherein the scanning frequency is controlled to be 1000±10% hertz.

10. An ion implanter, comprising:
an ion source configured to generate a plurality of positive ions, the ion source being positioned in a first vacuum chamber;
an extraction component configured to extract the plurality of the positive ions from the ion source to form an ion beam, the extraction component being positioned in the first vacuum chamber;
an accelerator configured to accelerate the ion beam, the accelerator comprising a series of electrodes isolated by dielectrics;
a focusing anode configured to focus the ion beam onto a wafer for ion implantation;
a stage configured to accommodate the wafer and control the wafer to move along a first direction; and
a deflection unit configured to deflect the ion beam in a second direction such that the ion beam scans back and forth in the second direction;
wherein the deflection unit is further configured to adjust a width of the ion beam in the second direction, the width of the ion beam is associated with an electromagnetic field generated by the deflection unit.

11. The ion implanter according to claim 10, wherein the first direction is perpendicular to the second direction.

12. The ion implanter according to claim 10, wherein the deflection unit is further configured to adjust the width of the ion beam in the second direction according to a width of a portion of the wafer currently scanned by the ion beam in the second direction.

13. The ion implanter according to claim 12, wherein the width of a portion of the wafer currently scanned by the ion beam in the second direction is associated with a movement of the wafer in the first direction.

14. The ion implanter according to claim 12, further comprises a beam current sensor configured to obtain and calculate the width of a portion of the wafer currently scanned by the ion beam in the second direction.

15. The ion implanter according to claim 14, wherein the beam current sensor comprises a Faraday cup.

* * * * *